United States Patent
Kobayashi et al.

(10) Patent No.: US 10,192,720 B2
(45) Date of Patent: Jan. 29, 2019

(54) PLASMA PROCESSING APPARATUS

(71) Applicant: Hitachi High-Technologies Corporation, Tokyo (JP)

(72) Inventors: Hiroyuki Kobayashi, Tokyo (JP); Nobuya Miyoshi, Tokyo (JP); Kazunori Shinoda, Tokyo (JP); Kenji Maeda, Tokyo (JP); Satoshi Sakai, Tokyo (JP); Masaru Izawa, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 218 days.

(21) Appl. No.: 15/210,257

(22) Filed: Jul. 14, 2016

(65) Prior Publication Data
US 2017/0018405 A1 Jan. 19, 2017

(30) Foreign Application Priority Data
Jul. 17, 2015 (JP) .................................. 2015-142567

(51) Int. Cl.
*H01J 37/32* (2006.01)
*H01L 21/67* (2006.01)

(52) U.S. Cl.
CPC ...... *H01J 37/321* (2013.01); *H01J 37/32724* (2013.01); *H01L 21/67115* (2013.01); *H01J 2237/334* (2013.01)

(58) Field of Classification Search
CPC .................................................. H01J 37/321
See application file for complete search history.

(56) References Cited

U.S. PATENT DOCUMENTS

| | | | | |
|---|---|---|---|---|
| 4,823,735 A | * | 4/1989 | Pichel | C23C 16/481 118/620 |
| 2006/0042757 A1 | * | 3/2006 | Kanno | H01J 37/32935 156/345.27 |
| 2011/0061812 A1 | | 3/2011 | Ganguly et al. | |

FOREIGN PATENT DOCUMENTS

JP  2013-522884 A  6/2013

\* cited by examiner

*Primary Examiner* — Joseph A Miller, Jr.
(74) *Attorney, Agent, or Firm* — Mattingly & Malur, PC

(57) ABSTRACT

A plasma processing apparatus includes a processing chamber to be depressurized in a vacuum vessel with a sidewall made of a transparent or translucent dielectric material, a stage in the processing chamber to mount a wafer thereon, a coil disposed around an outer side of the sidewall and supplied with radio-frequency power for forming plasma above the stage in the processing chamber, a lamp disposed above the coil outside the vacuum vessel which radiates light onto the wafer, and a reflector disposed the coil and reflecting light to irradiate an inside of the processing chamber.

11 Claims, 12 Drawing Sheets

PLASMA PROCESSING APPARATUS

BACKGROUND OF THE INVENTION

The present invention relates to plasma processing apparatuses for processing substrate-like specimens, such as semiconductor wafers, loaded on stages disposed in processing chambers inside vacuum vessels, using plasma formed in the processing chambers, and in particular, relates to a plasma processing apparatus for etching a processing-target film layer on a film structure preliminarily formed on a surface of a specimen by heating the specimen.

In order to satisfy requirements for reduced power consumption and increased memory capacities, further refined semiconductor devices have been prevailed and three-dimensional device structures have been widely promoted. Due to complicated, steric structures, devices having three dimensional structures, where film layers configuring circuits have conventionally been etched in longitudinal directions (depth directions of device circuit structures), tend to be frequently etched in lateral directions for manufacturing.

For such etching in lateral directions, wet processing through which processing-target film layers are processed and etched in a chemical solution has been implemented. Such wet processing is based on isotropic etching where the processing advances not only in a single direction, but also evenly on an entire circumference. When such wet processing is implemented in further refined circuits configured with narrower line widths, although such circuits are expected to be required in reality in future, such a problem that a structure including sidewalls of grooves on circuit patterns could be collapsed due to surface tension of a chemical solution is predicted to be revealed.

For this reason, as a technology for performing such isotropic etching, it is estimated that conventional wet processing should be replaced with dry processing that require no chemical solution. As a technology for achieving such isotropic dry etching at higher precision, an adsorption and desorption style etching method has been devised.

With this technology, a reaction layer having a minute thickness is first formed through a chemical reaction, between a material of a surface of a film layer and active particles, occurred by allowing the particles having higher reactivity, such as radicals generated in plasma, to be adsorbed on the surface of the etching-target film layer on a plurality of film structures including masks preliminarily disposed on surfaces of specimens, such as semiconductor wafers, for forming circuits (adsorption process). Next, thermal energy is added onto the reaction layer (to heat the layer) to allow this reaction layer to be evaporated, desorbed, and removed (desorption process). To etch at a desired amount, the adsorption and desorption processes are alternately repeated.

With this technology, upon the reaction layer reaches a certain thickness through adsorption processes, the reaction layer can prevent radicals from being reached to an interface between the processing-target film layer and the reaction layer, thus growth of the reaction layer is quickly reduced. Accordingly, it is thought that, even if radical flux is unevenly distributed inside a complex pattern shape, a reaction layer having a uniform thickness can be formed by adsorbing for an enough period, and an amount of etching can be uniform without depending on the pattern shape.

In such processes, a thickness of a reaction layer is limited in a range where atoms or molecules that can react with radicals adhered onto the atoms or molecules as a result of exposure to the radicals generated from plasma are present in a material configuring a surface of a processing-target film layer. Therefore, since it is predicted that, in a cycle of an adsorption process and a desorption process, an amount of etching can be controlled at or below a level of several nanometers, it is expected that an etching process where an amount of process can be adjusted with dimensional accuracy at or below several nanometers is achieved.

A technology described in JP-A-2013-522884, is conventionally known as an example of such a technology. In JP-A-2013-522884, an apparatus including a processing chamber coupled with a plasma source and a heating source, and a substrate support disposed inside the processing chamber is disclosed. The apparatus forms plasma through the plasma source with a gas supplied in the chamber to form an oxide layer, which is derived from reaction products, on a surface of a substrate, such as a wafer, loaded onto the substrate support, and heats the substrate so that a temperature of the substrate rises with heat radiated or conducted from the heating source by means of bringing the wafer close to the heating source, or another means, to sublimate oxides.

This conventionally known technology discloses a configuration where any plasma source that is based on inductive coupling, capacitive coupling, or similar coupling is used, and the heating source is disposed inside the substrate support, and where, during plasma is formed, radio-frequency (RF) power having a certain frequency is supplied onto an electrode disposed inside the substrate support to form bias potential above an upper surface of the substrate.

SUMMARY OF THE INVENTION

With the conventionally known technology described above, there are some problems since the following points were not fully taken into account in the technology.

That is, the conventionally known technology described above requires cooling of a wafer in an adsorption process (to lower a temperature of the wafer), while the technology requires heating of the wafer in a desorption process (to increase the temperature of the wafer). Therefore, it is necessary that such an apparatus equip with both of a wafer heating function and a wafer cooling function. Such means of heating and cooling wafers can include three methods as shown below.

A first method includes a configuration where a stage for loading a wafer is cooled so that the wafer is cooled in an adsorption process by allowing the wafer to thermally come into contact with the stage. On the other hand, in a desorption process, a thermal connection between the wafer and the stage is separated or refrained, and the wafer is heated through radiation of light by lighting the wafer with a lamp or a similar lighting device. A second method includes, as disclosed in JP-A-2013-522884, a configuration where a stage for loading a wafer is cooled, as same as the first method, but, at the same time, a member to be heated is disposed above the stage for loading a wafer so that the member faces the wafer. In an adsorption process where radicals are adsorbed, the stage and the wafer are thermally contacted to cool the wafer, while, in a desorption process, the wafer is brought close to the member that is disposed above and heated to increase a temperature of the member so as to heat the wafer via thermal conduction with a gas conducted between the member and the wafer.

A third method includes, in one of a plurality of chambers, a stage having a function for cooling a loaded substrate, and, in another one of the plurality of chambers, another stage having a function for heating the loaded substrate, where the wafer is subject to each of the adsorption process and the desorption process in each of the plurality of chambers.

Among these methods, the first method can heat wafers in relatively short periods, because the method heats the wafers with light radiated from a lamp without transferring the wafers. On the other hand, if a distance between the lamp and a wafer increases, a heating capability could be sacrificed. Thus, it is necessary to consider that what kind of arrangement be required for disposing a light source and a plasma source.

For example, a possible configuration is a one where a lamp is disposed immediately above a wafer, and a plasma source is disposed above the lamp. In such a configuration, a distance between a wafer and a heating source can be relatively reduced to improve a heating capability. However, a distance between the wafer and a plasma source could relatively be extended, leading to an impossibility of effectively supplying, onto a wafer surface, active particles, such as radicals, for forming a reaction layer, because, if a transfer period is prolonged due to an extended distance for which active particles, such as radicals, should move, life of active particles could expire in the transfer period.

In a configuration where a lamp, as a heating source, is disposed above a plasma source when viewed from a wafer in order to solve the problem described above, it is necessary that a plasma source having a higher degree of freedom in designing of an upper portion of the plasma source be selected. A preferable plasma source for such a purpose is a one that forms Inductivity Coupled Plasma (ICP) inside a processing chamber with radio-frequency power supplied in a coil disposed around an outer wall of a processing vessel made of dielectric material. For example, a configuration may be adopted, where the coil described above is disposed around an outer periphery of a sidewall of a processing vessel having a cylindrical form, and a member made of a transparent or translucent material, such as quartz, is disposed above an upper end of the sidewall to radiate light of a lamp from above.

However, in such an apparatus using an ICP type plasma source, where a quartz-made vessel sidewall wound with a coil on an outer periphery from a viewpoint of reduction in power loss is equipped, a wafer heating capability could be disadvantageously reduced, because many of light radiated inside the vessel from a lamp above the vessel leaks from the sidewall. On the other hand, if a metal coating or similar coating that can reflect light is applied onto an inner wall surface of a sidewall of a processing vessel, no induction magnetic field can be formed inside the vessel using radio-frequency power supplied into the coil. Such problems described above have not been taken into account in the conventionally known technology described above.

In view of the above problems in the conventional art, the present invention has an object to provide a plasma processing apparatus that can effectively radiate light, for heating, onto a wafer in a processing chamber, while supplying an electric field for forming plasma in the processing chamber inside a vessel.

The above object can be achieved by a plasma processing apparatus including: a processing chamber disposed inside a vacuum vessel having a sidewall made of a dielectric material having transparency or translucency, the processing chamber being internally reduced in pressure; a stage disposed at a lower portion inside the processing chamber to mount a wafer to be processed thereon; a coil disposed on an outer side of the sidewall therearound, the coil being supplied with radio-frequency power for forming plasma above the stage in the processing chamber; a lamp disposed above the coil outside the vacuum vessel, the lamp radiating light onto the wafer from an upper portion of the processing chamber; and a reflector disposed on an outer side of the coil therearound, the reflector reflecting light to irradiate an inside of the processing chamber.

According to a first aspect of the present invention, by reflecting IR light leaked outwardly from a processing chamber configuring a plasma source forming ICP type plasma with a reflector disposed outside an ICP coil to return the IR light inwardly into the chamber, unevenness in a wafer heating capability, in temperature values of wafers, and in distribution of the temperature values can be minimized, thus, wafer processing efficiency can be improved.

Other objects, features, and advantages of the invention will become apparent from the following description of the embodiments of the invention taken in conjunction with the accompanying drawings.

DESCRIPTION OF THE EMBODIMENTS

An embodiment of the present invention will now be described herein with reference to the drawings.

Embodiment 1

Figure 1:
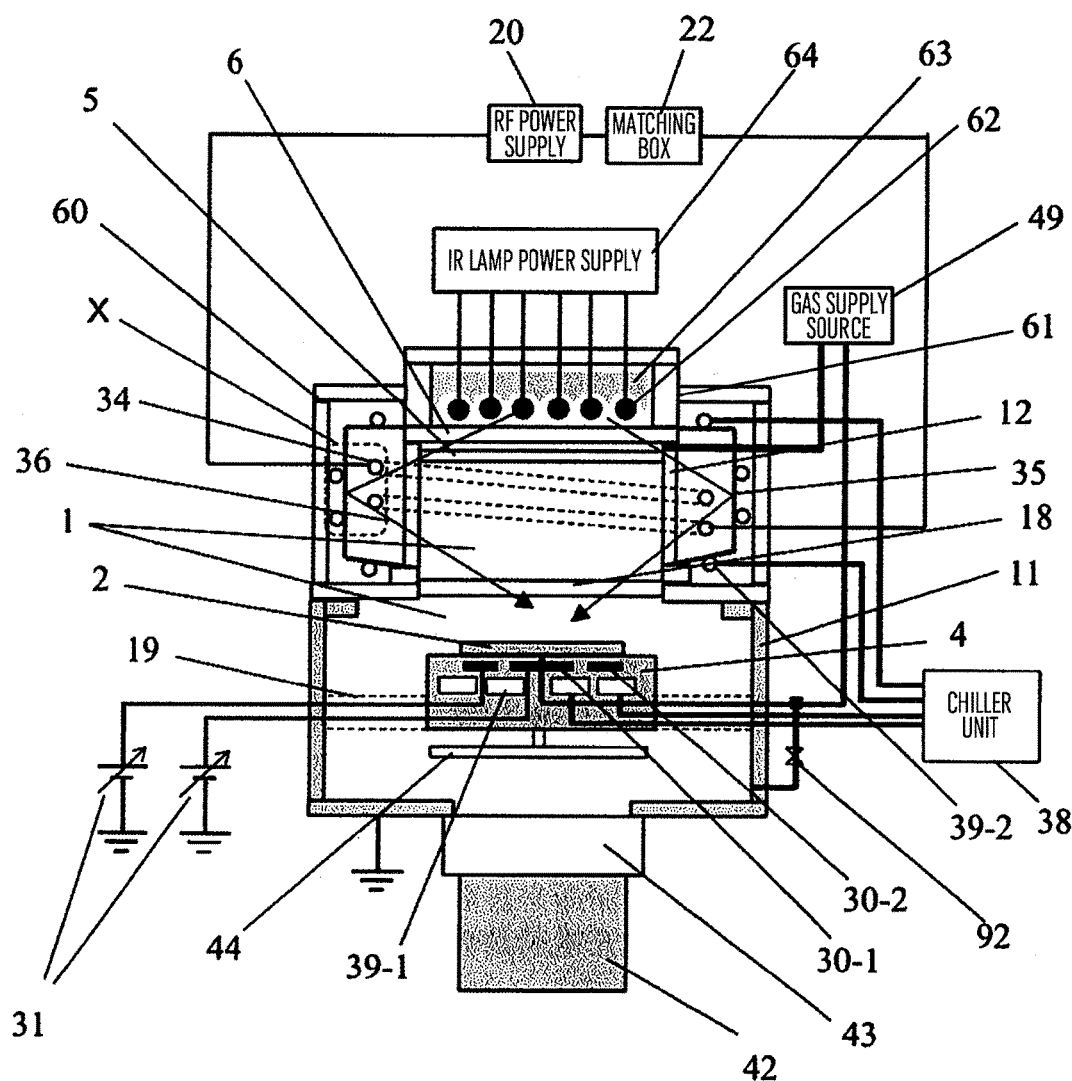
FIG. 1 is a longitudinal cross-sectional view schematically illustrating an outline of a configuration of a plasma processing apparatus according to an embodiment of the present invention.

First, an embodiment of the present invention will now be described herein by reference to FIGS. 1 to 10. FIG. 1 is a longitudinal cross-sectional view schematically illustrating an outline of a configuration of a plasma processing apparatus according to the embodiment of the present invention.

In the plasma processing apparatus according to the embodiment of the present invention shown in this figure, a cylindrical quartz chamber 12 configuring an ICP plasma source is disposed on an upper portion of a base chamber 11 so that the base chamber 11 and the quartz chamber 12 form a processing chamber 1. Below the quartz chamber 12, a wafer stage 4 for loading a wafer is disposed, and is held to the base chamber 11 with an arm 19.

An ICP coil 34 is disposed outside the quartz chamber 12, and is connected to a radio-frequency power supply 20 for generating plasma via a matching box 22. For radio-frequency power, a frequency in a frequency band of several tens of MHz, such as 13.56 MHz, is used.

A top plate 6 is disposed on an upper portion of the quartz chamber 12. The top plate 6 is entirely made of quartz, or disposed with a quartz window. Above the top plate 6, an infrared (IR) lamp unit 61 is disposed, inside which an IR lamp 62 is disposed, and an upper reflector 63 is disposed above the IR lamp 62. In addition, the IR lamp 62 is connected to an IR lamp power supply 64.

Below the quartz chamber 12 (below a height of the ICP coil 34, which is in a plasma generation area) and above a wafer 2, a slit 18 made of quartz is disposed. Through the slit 18, while radicals generated in plasma are radiated onto the wafer, radiation of ions generated in the plasma onto the wafer is reduced.

That is, the plasma processing apparatus according to the embodiment of the present invention includes a configuration where the slit 18 is disposed above the wafer 2, a space in which plasma is formed is disposed above the slit, and the IR lamp 62 is disposed above the space, and where a distance between the wafer 2 and the plasma is shortened to enhance efficiency of radiation of short-life radicals generated in the plasma onto the wafer 2.

Below the base chamber 11, a vacuum pump 42 and a pressure-regulating valve unit 43 are disposed. The vacuum pump 42 includes a turbo molecule pump, a rough pumping rotary pump, and other devices for reducing pressure inside the processing chamber in the vacuum vessel including the quartz chamber 12, the base chamber 11, and the top plate 6. The pressure-regulating valve unit 43 is disposed between an inlet of the vacuum pump 42 and a circular exhaust port disposed at a bottom of the base chamber 11 for exhausting gas in the processing chamber in order to adjust pressure in the chamber. In addition, a disc-like main valve 44 for increasing or decreasing a distance relative to the exhaust port or closing the exhaust port is disposed above the exhaust port in the processing chamber.

In the wafer stage 4, an electrode 30 for holding the wafer 2 with electrostatic chuck is embedded. This electrode 30 includes an inner electrode 30-1 and an outer electrode 30-2, each connected to a DC power supply 31 for electrostatic chuck. In addition, a refrigerant flows inside the wafer stage 4 through a refrigerant flow channel 39-1 for cooling the wafer 2, while a flow channel for allowing a cooling He gas to flow between a backside of the wafer 2 and the wafer stage 4 is disposed on a wafer loading face of the wafer stage 4 so that the He gas (hereinafter referred to as a backside He) is supplied from a gas supply source 49.

Between an outer side of the ICP coil 34 and an outside cover 60, a reflector 35 is disposed so that IR light 36 passed through the quartz chamber 12 and leaked outside the quartz chamber 12, among IR light emitted from the IR lamp 62, is returned inside the quartz chamber 12 again.

Figure 2:
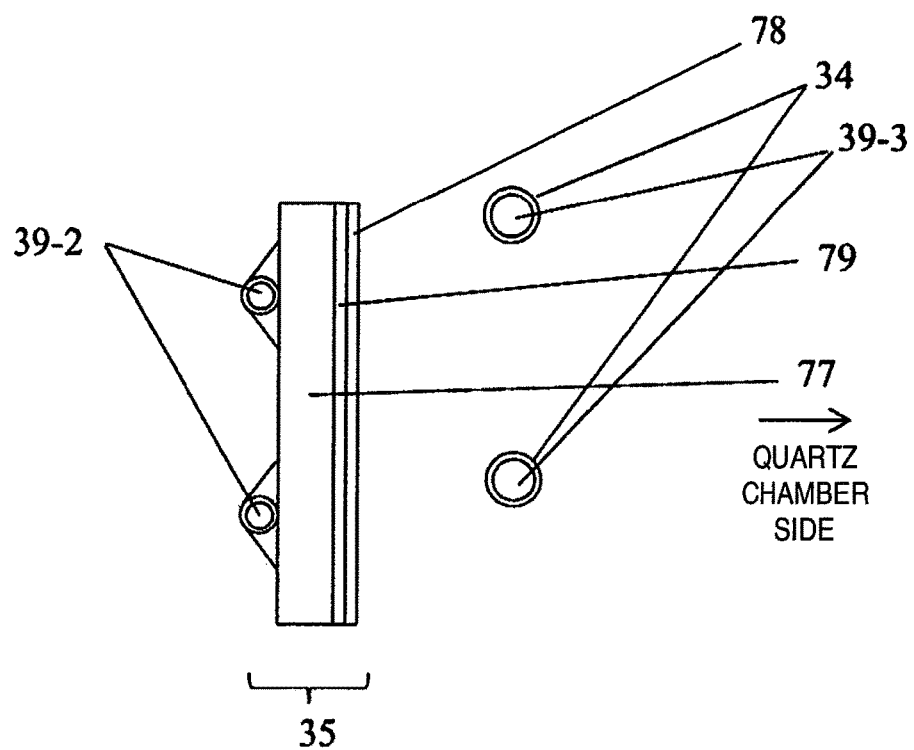
FIG. 2 is an enlarged, longitudinal cross-sectional view schematically illustrating a configuration of a portion including an ICP lamp according to the embodiment of the present invention shown in FIG. 1.

Next, the reflector 35 will now be described herein with reference to FIG. 2. FIG. 2 is an enlarged, longitudinal cross-sectional view schematically illustrating a configuration of a main part of the ICP lamp according to the embodiment of the present invention shown in FIG. 1. In particular, an area enclosed with broken lines indicated by reference symbol X in FIG. 1 is shown in an enlarged manner.

In this figure, the reflector 35 according to the embodiment of the present invention disposed further outside an outer periphery side of the ICP coil 34 wound to have a plurality of steps and disposed outside an outer periphery side of a sidewall of the quartz chamber 12 so as to have a predetermined distance from the sidewall, and extended longitudinally across the ICP coil 34 having the plurality of steps includes a base material 77, and a reflecting layer 78 and an adhesion layer 79, which are disposed over an inner surface (facing the quartz chamber 12 shown on right in the figure) of the base material 77.

In addition, on an outer surface (facing the outside cover 60 shown on left in the figure) of the base material 77 of the reflector 35 disposed in a ring shape outside and around an outer periphery side of the ICP coil 34, a refrigerant flow channel 39-2 for cooling the reflector 35 is disposed to abut with the reflector 35 so that the refrigerant flow channel is wound in a plurality of steps in a helical manner. The refrigerant flow channel 39-2 is connected to a chiller unit 38 shown in FIG. 1 so that a refrigerant at a temperature adjusted in the chiller unit 38 is supplied, flowed, and circulated inside the refrigerant flow channel.

In addition, a thermally conductive metal, such as aluminum, copper, or stainless steel, is used for the base material 77. Further, a metal that is highly reflective with IR light, such as gold or aluminum, is used for the reflecting layer 78. Although the reflector 35 according to the embodiment of the present invention includes the adhesion layer 78 interposed between the base material 77 and the reflecting layer 78 to reduce uneven connection between the base material 77 and the reflecting layer 78, the adhesion layer 79 may be omitted if the base material 77 and the reflecting layer 78 can be well adhered.

Furthermore, in FIG. 2, an inner surface of the reflecting layer 79 on an internal side of the reflector 35 is made flat so that directions of angles at which light radiated from inside the quartz chamber 23 is reflected become uniform in circumferential directions. If differences in heating by IR are significant in in-plane directions of the wafer 2 due to such mirror reflection, the reflecting layer 79 may have an uneven inner surface, as shown in FIG. 10.

Figure 10:
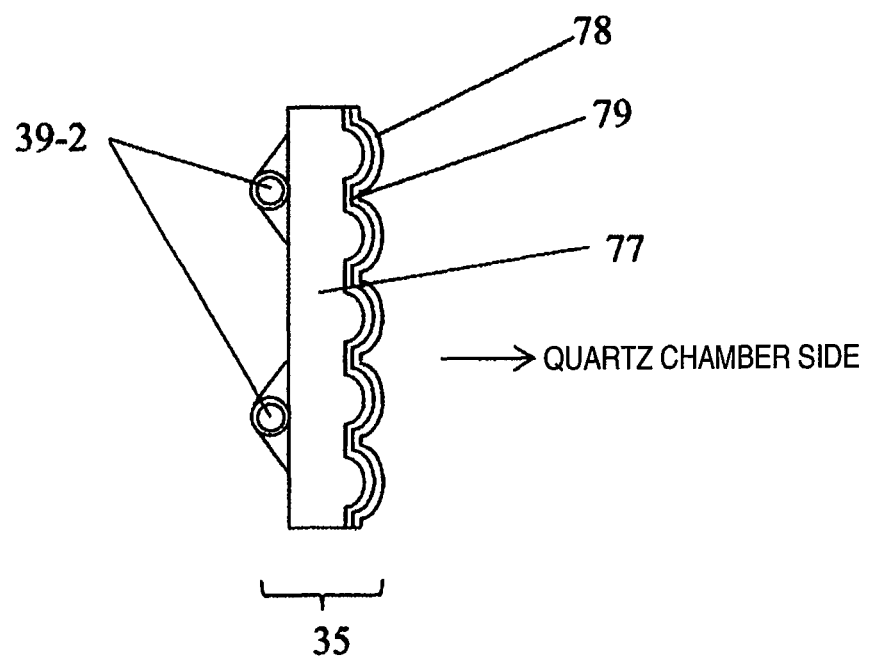
FIG. 10 is an enlarged, longitudinal cross-sectional view schematically illustrating a configuration of another configuration example of a main part of the ICP coil according to the embodiment of the present invention shown in FIG. 2.

FIG. 10 is an enlarged, longitudinal cross-sectional view schematically illustrating a configuration of another configuration example of a main part of the ICP coil according to the embodiment of the present invention shown in FIG. 2.

This uneven surface can reduce unevenness in heating of the wafer 2 through light radiated from inside the quartz chamber 12 irregularly reflected and returned inside the quartz chamber 12 so as to improve uniformity in temperature or distribution of the temperature on the wafer 2.

In addition, the ICP coil 34 is heated by IR light radiated from inside the quartz chamber 12. To reduce rise in temperature exceeding an allowable range due to this heating, a refrigerant flow channel 39-3 into which a refrigerant flows inside is disposed inside the ICP coil 34.

The refrigerant flow channel 39-3 is also connected to the chiller unit 38 so that the refrigerant maintained at a predetermined temperature circulates and flows. Further, a surface of the ICP coil 34 may be vapor-deposited with a metal having relatively higher reflectivity, such as gold or aluminum, to reflect IR light on the surface.

Figure 3:
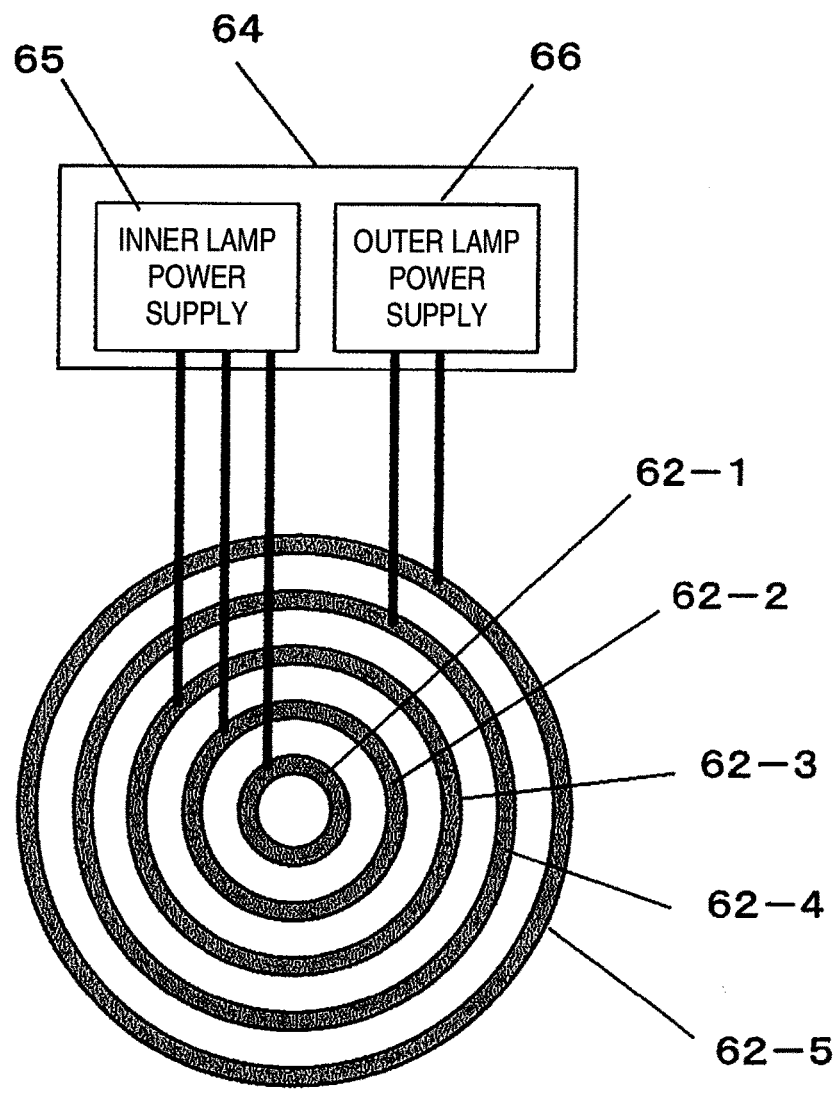
FIG. 3 is a plan view schematically illustrating an outline of a configuration of an IR lamp according to the embodiment of the present invention shown in FIG. 1.

FIG. 3 is a plan view schematically illustrating an outline of a configuration of the IR lamp according to the embodiment of the present invention shown in FIG. 1. This figure shows an outline of a shape of the IR lamp 62 when viewed from the wafer 2 loaded under the lamp.

The IR lamp 62 according to the embodiment of the present invention includes a plurality of ring-shaped IR lamps 62-1 to 62-5 each having a different diameter and disposed in a concentric, multilayer manner so that the entire IR lamp has a circular shape. In this embodiment of the present invention, five IR lamps 62-1 to 62-5 each having a different diameter are disposed.

The IR lamp 62 is electrically connected to an IR lamp power supply 64 so as to be supplied with power from the power supply. The IR lamp power supply 64 includes an inner lamp power supply 65 and an outer lamp power supply 66. In this embodiment of the present invention, three IR lamps 62-1 to 62-3 on an inner side are connected to the inner lamp power supply 65, while two IR lamps 62-4 and 62-5 on an outer side are connected to the outer lamp power supply 66 so that power is supplied to each lamp. In this embodiment of the present invention, such a configuration allows adjustments of, between the inner side and the outer side of the IR lamp 62, independently supplied power and an amount of light to be emitted so that a desired amount of heat for heating the wafer 2 or desired temperature values in in-plane directions and distribution are achieved.

Next, a configuration for supplying a processing gas according to the embodiment of the present invention will now be described herein. In FIG. 1, a processing gas is supplied, via a gas supply path coupled to the processing chamber, from the gas supply source 49 including storage units, such as tanks, coupled to the path, supplied to a gap between the top plate 6 and a shower plate 5 disposed to face the processing chamber 1 that is a space for forming plasma and disposed in the vacuum vessel under the top plate via a gas supply path, and dispersed in an area of the gap.

Then the gas is supplied from above and into the processing chamber via a plurality of gas holes disposed at a center of the shower plate 5. The gas supply source 49 includes a cylinder cabinet, a pressure reducing valve, a mass flow controller for controlling gas flow rate, a vaporizer for vaporizing liquid, and other devices, the cylinder cabinet accommodating gas cylinders.

Figure 4:
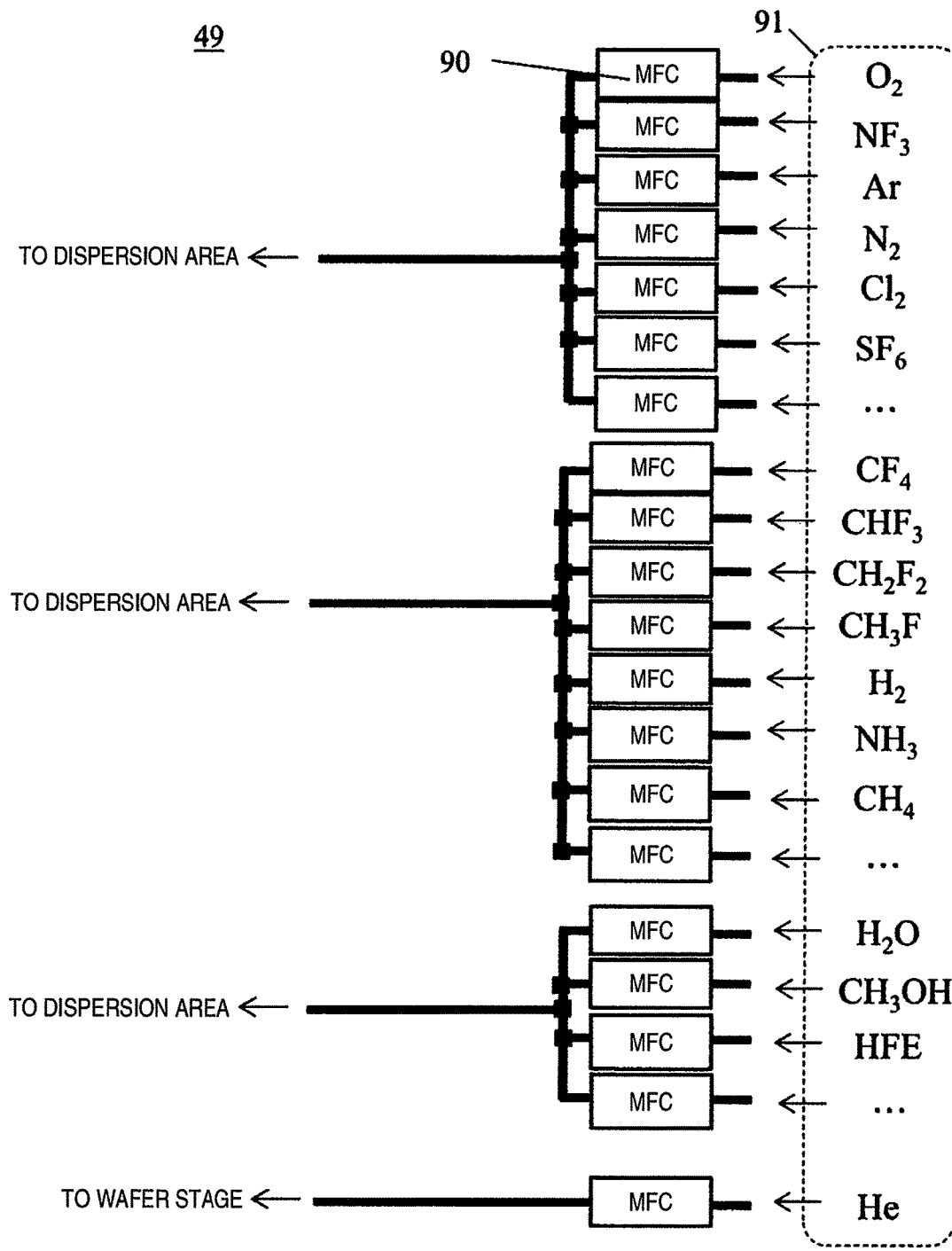
FIG. 4 is a view schematically illustrating a configuration of a gas supply source according to the embodiment of the present invention shown in FIG. 1.

A configuration of the gas supply source for a processing gas according to the embodiment of the present invention will now be described herein by reference to FIG. 4. FIG. 4 is a view schematically illustrating the configuration of the gas supply source according to the embodiment of the present invention shown in FIG. 1.

In this figure, reference numeral 91 denotes a collection of processing gas species that the plasma processing apparatus according to the embodiment of the present invention can use for processing the wafer 2. Gases, among the collection of the types of gases, belonging to a combination (collection) of a plurality of the types of gases and used for processing the wafer 2 are each stored in the respective gas storage units configuring the gas supply source 49, and each adjusted for a flow rate or speed in the supply path by a mass flow controller 90 in the supply path disposed for each of the types of gases.

The gas supply paths where the flow rates or speeds are adjusted are merged into a single path, and, through the path, the gases are supplied in the gas dispersion area in the gap between the top plate 6 and the shower plate 5. The gas supply source 49 according to the embodiment of the present invention has three combinations of such pluralities of gases so that combinations appropriate for processing the required wafer 2 based on a specification are properly selected by a user or a controller (not shown in the figures) electrically connected to the plasma processing apparatus.

Furthermore, He to be supplied in a gap between the wafer 2 and a dielectric film that configures an upper surface of the wafer stage 4 and internally disposed with electrostatic chuck electrodes 30-1 and 30-2 is supplied via a through hole that vertically passes inside the wafer stage 4, after a flow rate or speed is adjusted through the mass flow controller 90 based on a value of pressure in the gap between the wafer 2 and the wafer stage 4 detected based on an output from a detector that is not shown in the figures.

In the embodiment of the present invention, the processing gases include $O_2$, $NF_3$, Ar, $N_2$, $Cl_2$, $SF_6$, $CF_4$, $CHF_3$, $CH_2F_2$, $CH_3F$, $H_2$, $NH_3$, $CH_4$, $H_2O$, $CH_3OH$, HFE (hydro fluoro ether), and other chemicals. In addition, $C_xF_y$ gases, such as $C_4F_8$, and other gases including HBr and $BCl_3$ may be used.

Figure 5:
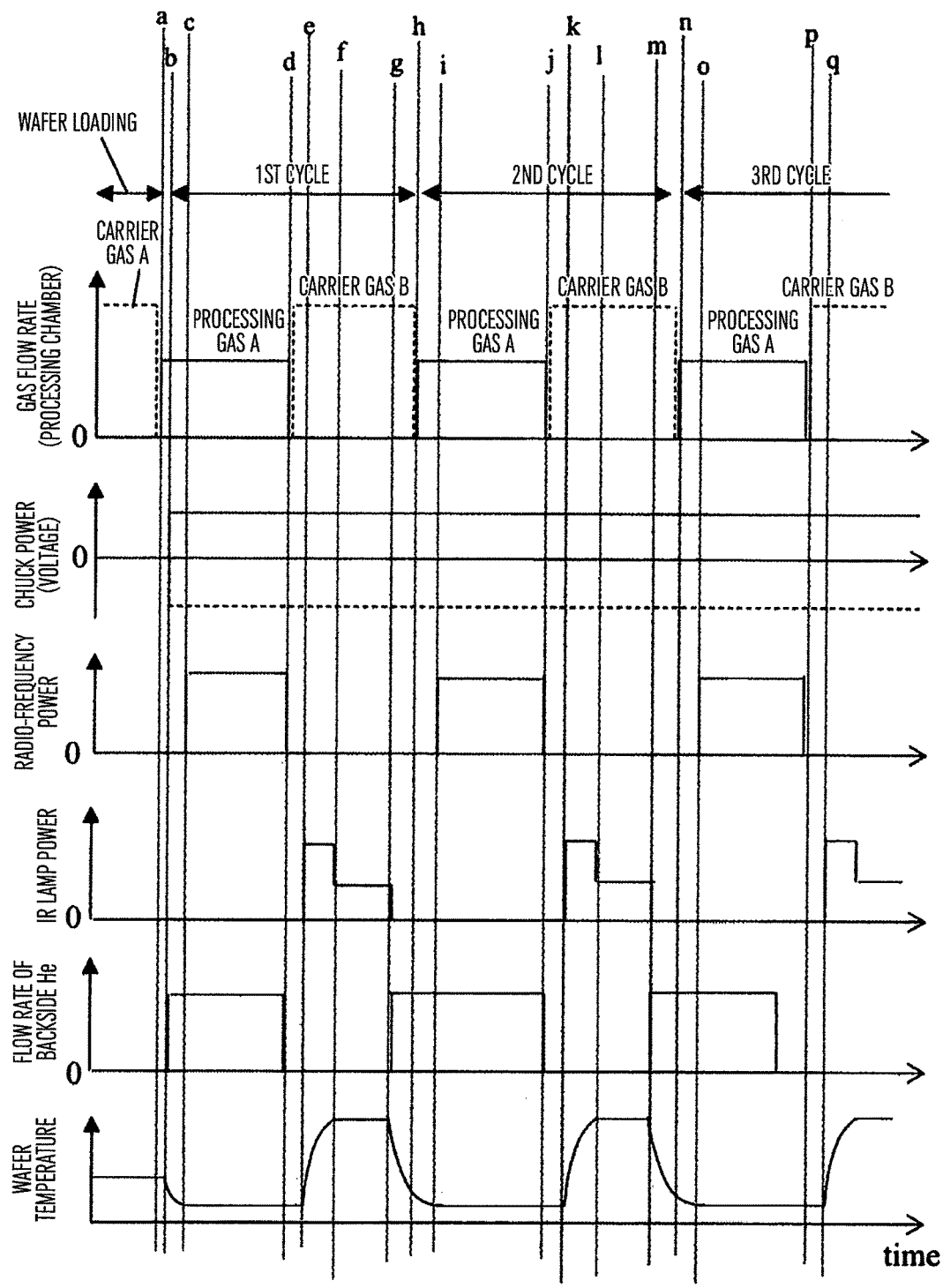
FIG. 5 is a time chart illustrating a flow of operation of an etching process performed by the plasma processing apparatus according to the embodiment of the present invention shown in FIG. 1.
Figure 6:
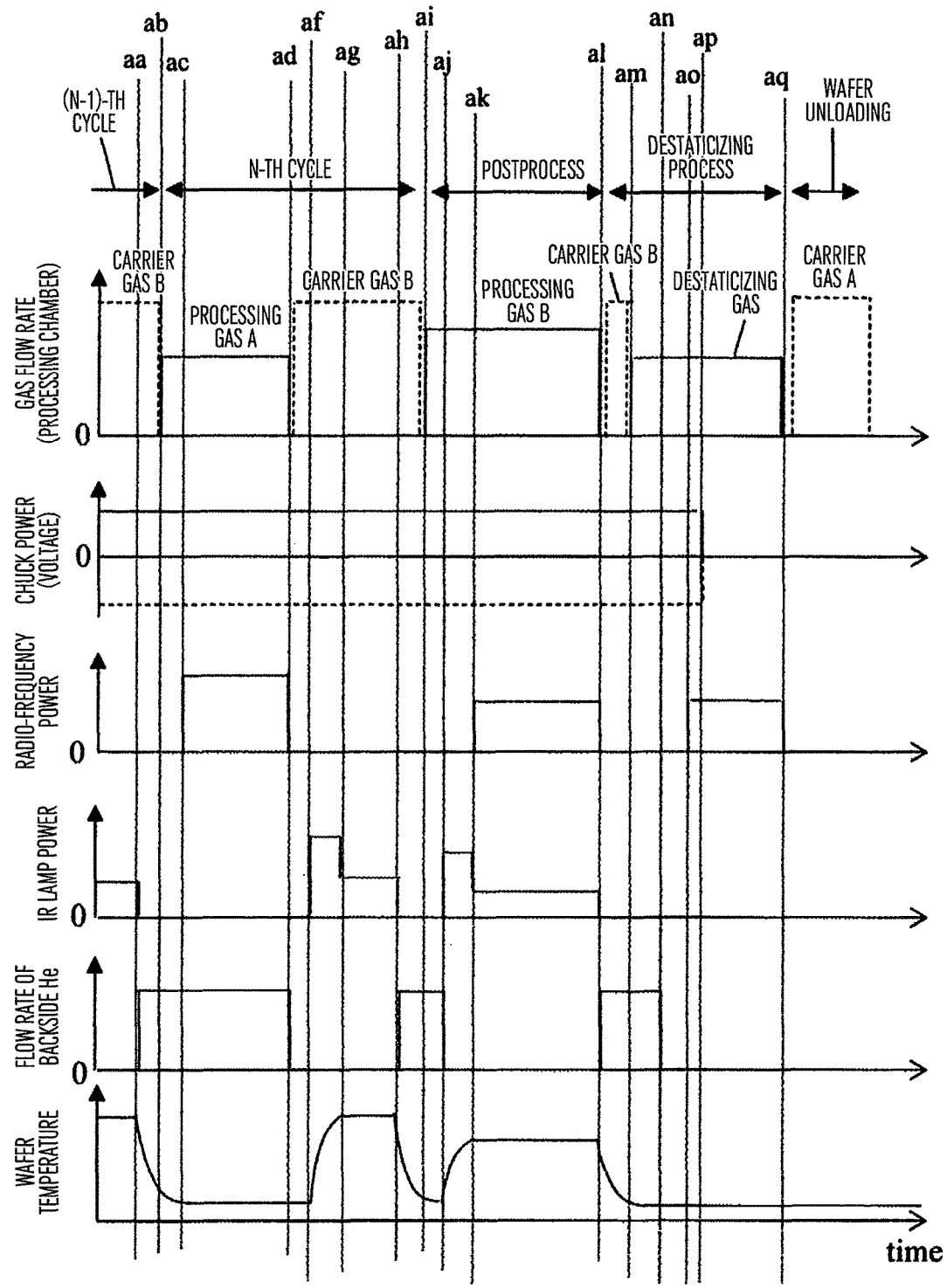
FIG. 6 is another time chart illustrating the flow of operation of the etching process performed by the plasma processing apparatus according to the embodiment of the present invention shown in FIG. 1.
Figure 7:
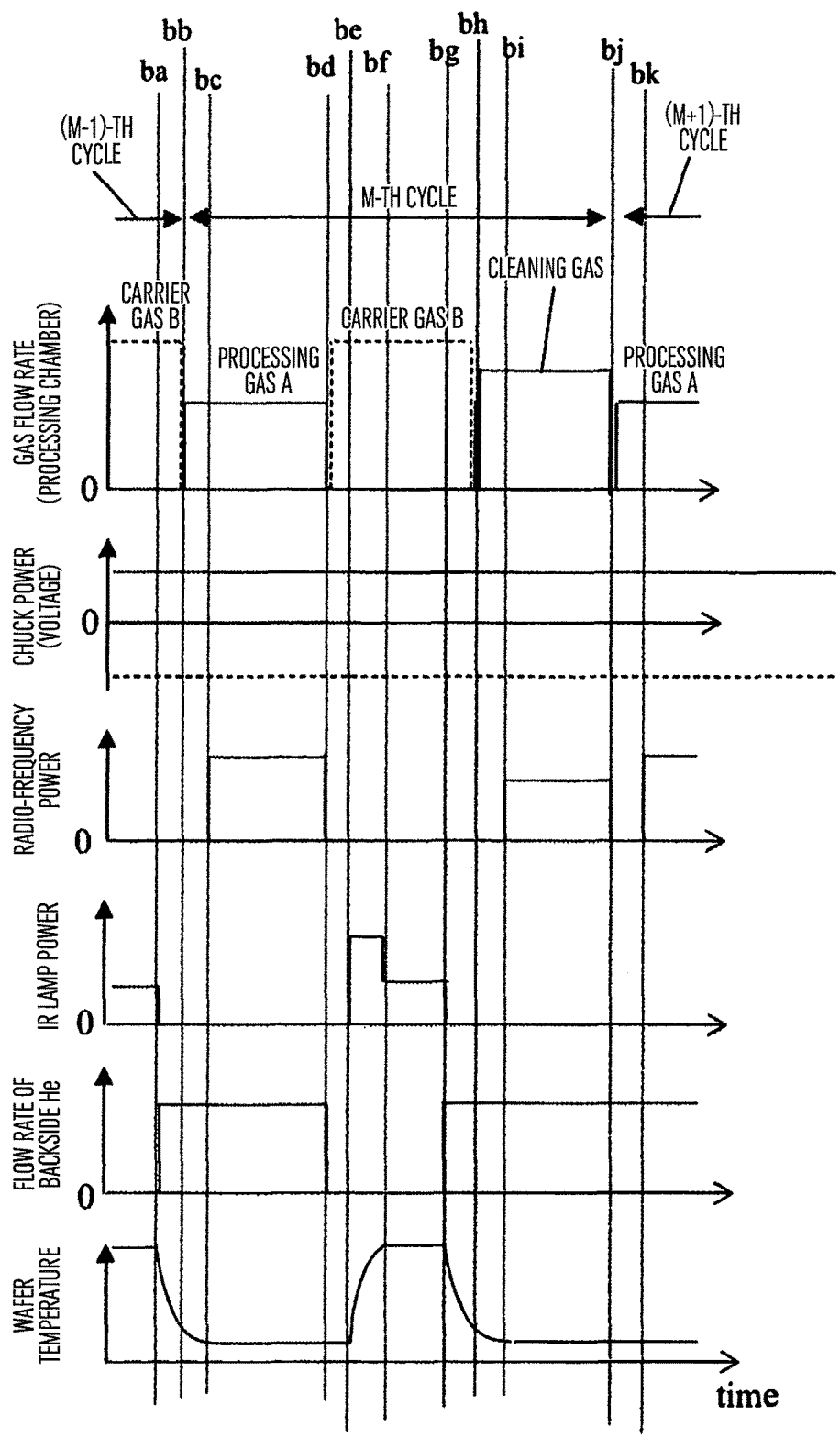
FIG. 7 is still another time chart illustrating the flow of operation of the etching process performed by the plasma processing apparatus according to the embodiment of the present invention shown in FIG. 1.
Figure 8:
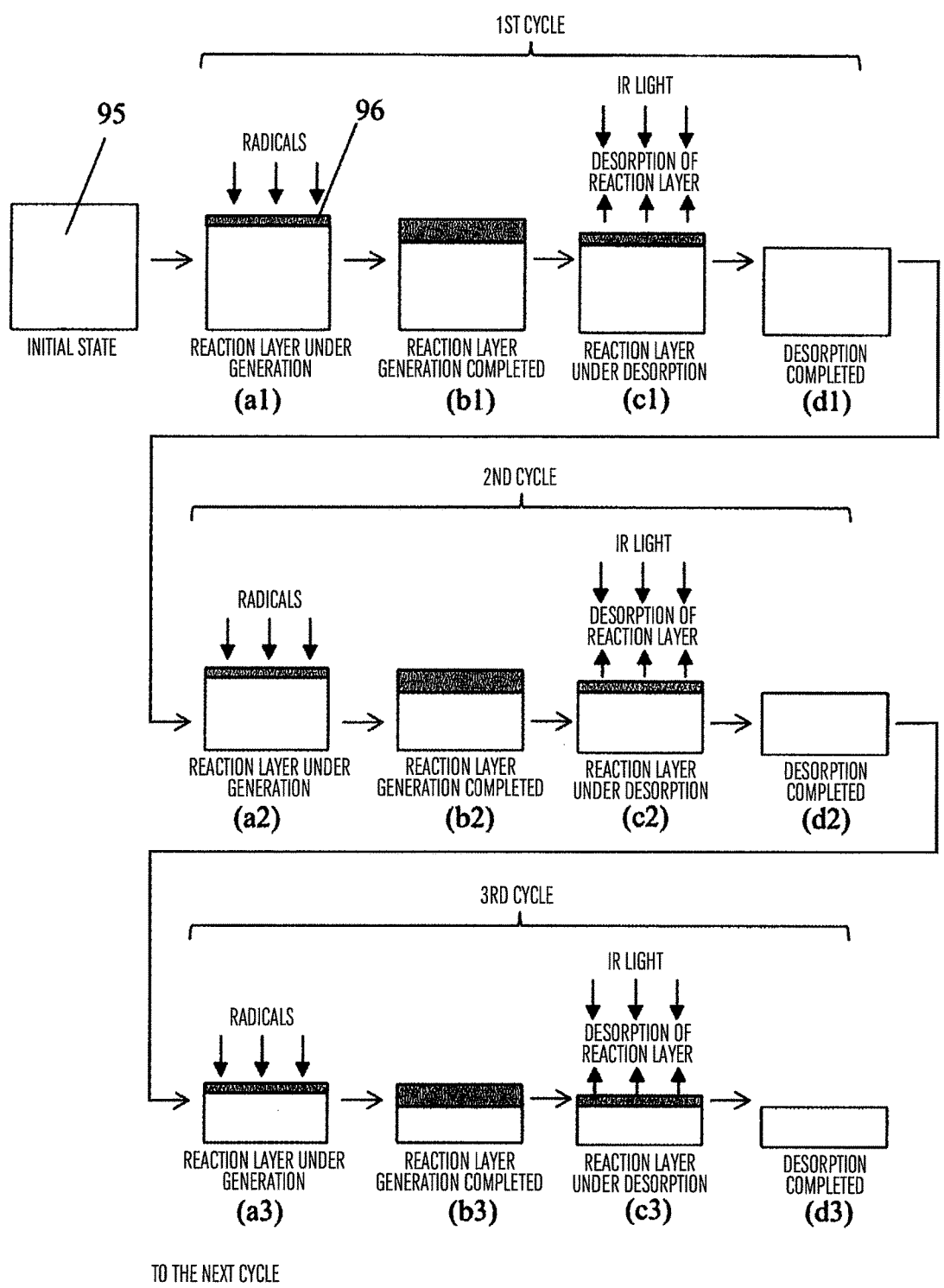
FIG. 8 is a longitudinal cross-sectional view schematically illustrating changes in a shape of a to-be-etched layer along with advancement of the etching process shown in FIGS. 5 to 9 performed by the plasma processing apparatus according to the embodiment of the present invention shown in FIG. 1.
Figure 9:
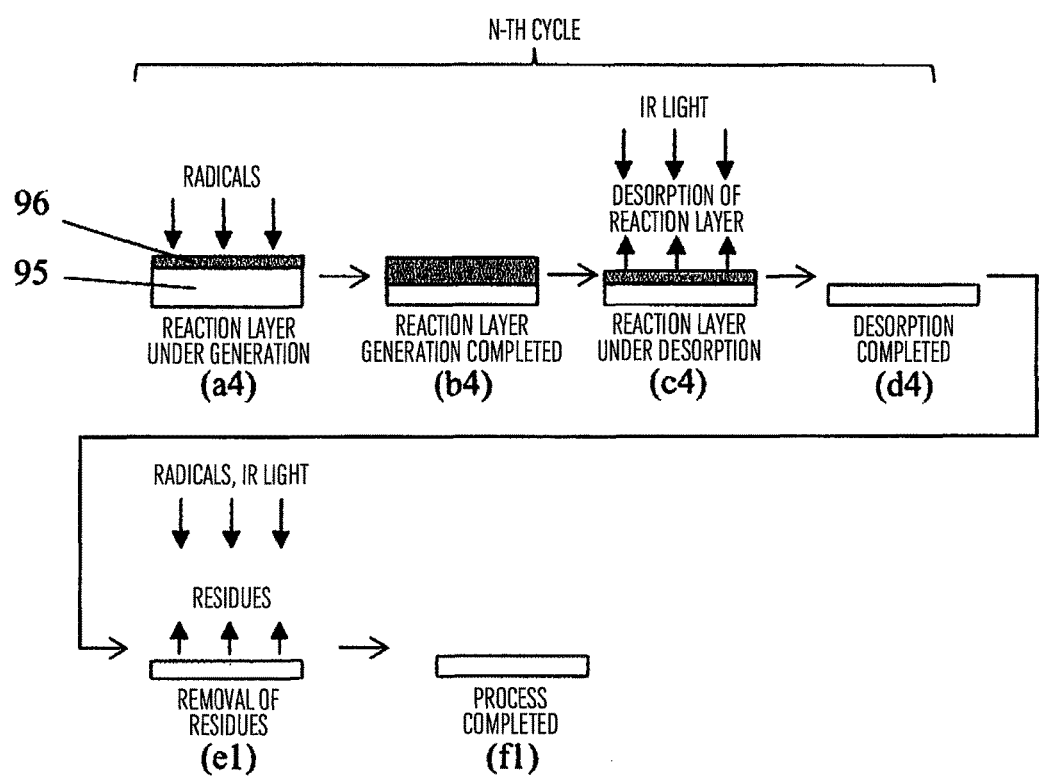
FIG. 9 is another longitudinal cross-sectional view schematically illustrating changes in the shape of the to-be-etched layer along with advancement of the etching process shown in FIGS. 5 to 9 performed by the plasma processing apparatus according to the embodiment of the present invention shown in FIG. 1.

Next, a procedure of an etching process to be performed in the embodiment of the present invention will now be described herein by reference to FIGS. 5 to 9. FIGS. 5 to 7 are time charts illustrating a flow of operation of etching process performed by the plasma processing apparatus according to the embodiment of the present invention shown in FIG. 1. FIGS. 8 and 9 are longitudinal cross-sectional views schematically illustrating changes in a shape of a to-be-etched layer 95 along with advancement of the etching process shown in FIGS. 5 to 9 performed by the plasma processing apparatus according to the embodiment of the present invention shown in FIG. 1.

First, the wafer 2 is transferred into the processing chamber while a carrier gas A is supplied in the processing chamber. Next, supply of a processing gas is started (Point a in FIG. 5). After that, the DC power supply 31 is caused to apply chuck power onto the electrode 30 to start electrostatic chuck, and, at the same time, supply of a He gas into the backside of the wafer is started (Point b in FIG. 5).

After a temperature of the wafer reaches a predetermined temperature (approximately identical to a temperature of the wafer stage), plasma is caused to be generated with radio-frequency power (Point c in FIG. 5) to cause radicals to be adsorbed on a surface of a target etching layer to form a reaction layer 96 (a1 of FIG. 8). After a thickness of the reaction layer reaches a predetermined thickness (b1 of FIG. 8), electric discharge is stopped, as well as the supply of the He gas is stopped (unless otherwise stated herein, stopping the supply of the He gas should require opening of a valve 92 to discharge helium in a gap between the backside of the wafer and the wafer stage, while starting the supply of the He gas should require closing the valve 92).

In addition, the supply of the processing gas is stopped, and supply of a carrier gas B is started (Point d in FIG. 5). After the processing gas has been replaced with the carrier gas B at a certain amount, the IR lamp 62 is turned on to start heating the wafer (Point e in FIG. 5).

As the temperature of the wafer rises, desorption on the reaction layer starts (c1 of FIG. 8). After the temperature of the wafer reaches a predetermined temperature (approximately 100° C. to 300° C.), power to the IR lamp 62 is reduced to maintain the temperature of the wafer at a constant temperature (Point f in FIG. 5).

After desorption on the reaction layer completes, the IR lamp 62 is turned off, and then a backside He is supplied to cool the wafer (Point g in FIG. 5 and d1 of FIG. 8). After the temperature of the wafer lowers at or below a certain value (at or below a several tens of ° C.), the gas being supplied is switched from the carrier gas B to a processing gas A, and a second cycle is initiated (Point h in FIG. 5).

After the temperature of the wafer lowers to a predetermined value, electric discharge is started so that radicals are adsorbed on a surface of the target etching layer to form another reaction layer (Point i in FIG. 5 and a2 of FIG. 8). After a thickness of the reaction layer reaches a predetermined thickness, electric discharge is stopped, the gas is switched from the processing gas to the carrier gas B, and the supply of the backside He is stopped (Point j in FIG. 5).

After the processing gas has been replaced with the carrier gas B, the IR lamp 62 is turned on to start heating the wafer (Point k in FIG. 5). After the wafer is heated to a predetermined temperature, the power to the lamp is reduced to maintain the temperature of the wafer at a constant temperature (Pint 1 in FIG. 5). After desorption on the reaction layer completes, turn off the lamp, and the backside He is supplied to cool the wafer (Point m in FIG. 5). After the temperature of the wafer lowers to a predetermined temperature, a third cycle is initiated again (Point n in FIG. 5).

As described above, etching proceeds digitally by repeating a process starting from cooling of the wafer to allow radicals to be adsorbed so as to form a reaction layer (adsorption process, a1, a2, and a3 of FIG. 8 and a4 of FIG. 9) to heating of the wafer to desorb the reaction layer (desorption process, c1, c2, and c3 of FIG. 8 and c4 of FIG. 9). After the wafer is etched N times, the backside He is supplied to cool the wafer (Point ai in FIG. 6).

Next, to remove slight amount of residues and other substances left on the surfaces, supply of a processing gas B is started. After a gas atmosphere in the processing chamber is replaced with the processing gas B, the IR lamp 62 is turned on to heat the wafer (Point aj in FIG. 6).

After the temperature of the wafer reaches a predetermined temperature, the power to the lamp is reduced to maintain the temperature of the wafer at a constant temperature, and start electric discharge to remove the residues (Point ak in FIG. 6, e1 of FIG. 9). After the residues are removed, the electric discharge and the supply of the processing gas B is stopped, and supply of the carrier gas B and the backside He is started (Point a1 in FIG. 6).

After the temperature of the wafer lowered at or below a predetermined temperature, supply of a destaticizing gas is started (Point am in FIG. 6) to release electrostatic chuck. After the temperature of the wafer is fully lowered, the supply of the backside He is started (Point an in FIG. 6).

Next, plasma discharge is stopped (Point ao in FIG. 6), and a voltage for electrostatic chuck is turned off (Point ap in FIG. 6). After destaticization completes, the discharge is stopped, and supply of the carrier gas A is started (Point aq in FIG. 6), and then the wafer is unloaded from the processing chamber.

In addition, as shown in FIG. 7, after the reaction layer is removed in each cycle, a cleaning gas may be used to perform cleaning-discharge for cleaning an inner wall of the processing chamber. In this case, after the reaction layer is removed, supply of the carrier gas B is started, the IR lamp 62 is turned off, and supply of the backside He is started, and, upon the temperature of the wafer lowers at or below a predetermined temperature value, supply of the cleaning gas is started (Point bh in FIG. 7).

Next, radio-frequency power is applied to start plasma discharge (Point bi in FIG. 7). When cleaning is complete, the discharge is stopped, and then a next cycle ((M+1)-th cycle) is initiated (Point bj in FIG. 7).

Furthermore, although the temperature of the wafer is lowered during cleaning in FIG. 7, for some processing gases and some materials of layers that are etched or not etched, wafers may have better be heated by the IR lamp 62 during cleaning for better results.

For gases, Ar, $N_2$, and other gases may be used for the carrier gases A and B. For the processing gas A, $NF_3$ gas, $NH_3$ gas, or $H_2$ gas may be used when a target etching layer is made of $SiO_2$, while a gas containing carbon, fluorine, hydrogen, oxygen, and/or the like may be used when the target etching layer is made of SiN. For removing residues, $O_2$ gas, $H_2O$ gas, $H_2$ gas, $CH_3OH$ gas, and other gases may be used. $SF_6$, $O_2$, $H_2$, or other gas may be used for a cleaning gas. Ar or another substance may be used for a destaticizing gas.

As described above, etching can be digitally performed by alternately repeating an adsorption process and a desorption process.

Variations

Figure 11:
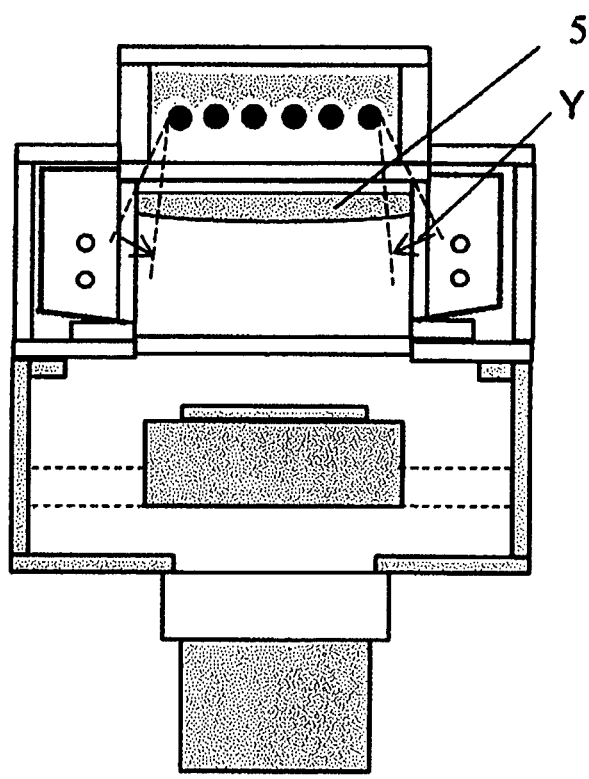
FIG. 11 is a longitudinal cross-sectional view schematically illustrating an outline of a configuration of a plasma processing apparatus according to a variation of the embodiment of the present invention shown in FIG. 1.
Figure 12:
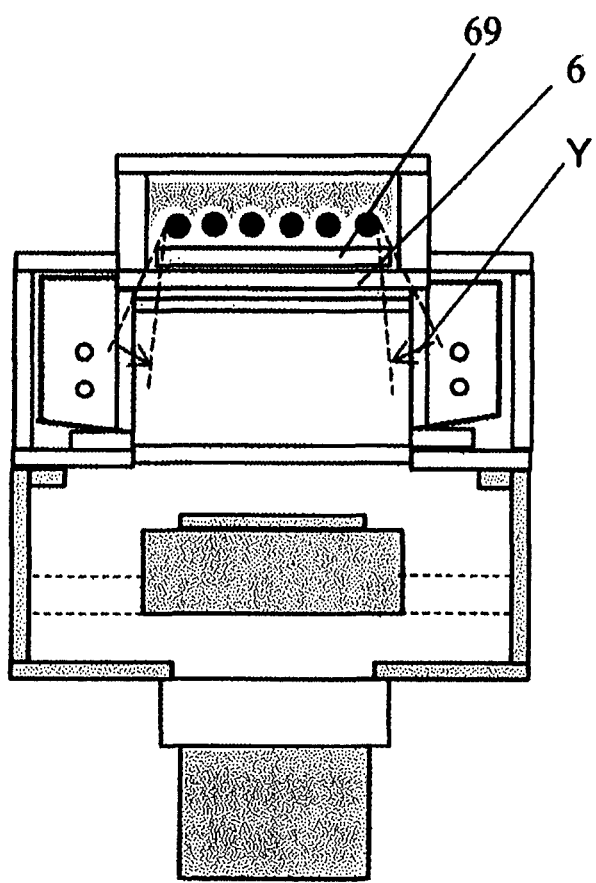
FIG. 12 is a longitudinal cross-sectional view schematically illustrating an outline of a configuration of a plasma processing apparatus according to another variation of the embodiment of the present invention shown in FIG. 1.

Variations of the present invention will now be described herein with reference to FIGS. 11 and 12. In these figures, descriptions of configurations equivalent or identical to the description of the embodiment of the present invention shown above are omitted. FIGS. 11 and 12 are longitudinal cross-sectional views schematically illustrating outlines of configurations of plasma processing apparatuses according to variations of the embodiment of the present invention shown in FIG. 1.

FIG. 11 is a longitudinal cross-sectional view schematically illustrating an outline of a configuration of a plasma processing apparatus according to a variation of the embodiment of the present invention shown in FIG. 1. A difference between the variation shown in this figure and the embodiment shown in FIG. 1 is that a quartz-made shower plate 5 having a disc shape according to the variation shown in this figure has distribution of changes in thickness values in radial directions from a center of the shower plate toward a peripheral edge.

In this variation of the present invention, a thickness at a center portion is greater than a thickness of a portion on an outer periphery side, where the thickness is gently changed from the center portion toward the portion on the outer periphery side so as to act as a lens that refracts IR light radiated from an IR lamp 62 above toward the center side so as to change directions of the IR light. That is, as denoted by reference symbol Y in FIG. 11, a configuration is provided, which can minimize wide radiation of IR light that passes through a top plate 6 and a shower plate 5 toward an outer periphery side, relative to a center of a quartz chamber 12, as well as can prevent an area of the radiation from being expanded. Instead of or in addition to the shower plate 5, the top plate 6 may have distribution of thickness which renders a similar lens function.

In addition, as shown in FIG. 12, a lens 69 is disposed between a top plate 6 made of quartz and an IR lamp 62 so as to minimize expansion of IR light in a processing chamber. The shower plate 5 and the top plate 6 shown in FIG. 11 and the lens 69 shown in FIG. 12 may respectively has a convex lens structure or a similar structure, or be a Fresnel lens or a similar lens.

Although the embodiments and variations of the present invention have been described, the present invention is not limited to the embodiments and variations described above, and various modifications, additions, and substitutions are possible, without departing from the scope of the present invention.

The invention claimed is:

1. A plasma processing apparatus comprising:
   a processing chamber disposed inside a vacuum vessel having a sidewall made of a dielectric material having transparency or translucency, the processing chamber configured to be internally reduced in pressure;
   a stage disposed at a lower portion inside the processing chamber and configured to mount a wafer to be processed thereon;
   a coil disposed around outer side of the sidewall, the coil configured to be supplied with radio-frequency power and form plasma above the stage in the processing chamber;
   a lamp disposed above the coil outside the vacuum vessel, the lamp configured to radiate light onto the wafer from an upper portion of the processing chamber;
   a reflector disposed around an outer side of the coil, the reflector configured to reflect the light to radiate towards an inside of the processing chamber; and
   a member disposed between the lamp and the stage, the member being configured to change direction of the light from the lamp and suppress expansion of the light toward an outside of the processing chamber.

2. The plasma processing apparatus according to claim 1, wherein a step of processing a film layer disposed on an upper surface of the wafer is performed at least once by heating the wafer with the light radiated from the lamp after particles in the plasma formed in the processing chamber 1 are supplied onto the upper surface of the wafer during processing of the wafer.

3. The plasma processing apparatus according to claim 2, wherein the processing chamber includes a top plate made of a material having transparency or translucency, the top plate configuring an upper portion of the vacuum vessel above the processing chamber,
   wherein the lamp is disposed above the top plate, and the lamp includes a plurality of lamps configured to independently adjust the respective light radiated from the lamps.

4. The plasma processing apparatus according to claim 3, wherein the member is disposed between the top plate and the stage.

5. The plasma processing apparatus according to claim 3, wherein the member is constituted by a shower plate disposed between the top plate and the stage.

6. The plasma processing apparatus according to claim 1, wherein the processing chamber includes a top plate made of a material having transparency or translucency, the top plate configuring an upper portion of the vacuum vessel above the processing chamber,
   wherein the lamp is disposed above the top plate, and the lamp includes a plurality of lamps configured to independently adjust the respective light radiated from the lamps.

7. The plasma processing apparatus according to claim 6, wherein the member is disposed between the top plate and the stage.

8. The plasma processing apparatus according to claim 6, wherein the member is constituted by a shower plate disposed between the top plate and the stage.

9. The plasma processing apparatus according to claim 1, wherein the lamp includes a plurality of lamps configured to independently adjust the respective light radiated from the lamps, and
   wherein the plurality of lamps are circular and disposed concentrically.

10. The plasma processing apparatus according to claim 3, wherein the plurality of lamps are circular and disposed concentrically.

11. The plasma processing apparatus according to claim 6, wherein the plurality of lamps are circular and disposed concentrically.

* * * * *